United States Patent [19]
Lee

[11] Patent Number: 5,932,160
[45] Date of Patent: Aug. 3, 1999

[54] PROCESS AND MOLD FOR ENCAPSULATING SEMICONDUCTOR CHIPS HAVING RADIAL RUNNERS

[75] Inventor: Jong Myong Lee, Asan, Rep. of Korea

[73] Assignee: Samsung Electronics Co., Ltd., Suwon, Rep. of Korea

[21] Appl. No.: 09/038,933

[22] Filed: Mar. 12, 1998

[30] Foreign Application Priority Data

Mar. 25, 1997 [KR] Rep. of Korea ...................... 97-10200

[51] Int. Cl.⁶ ........................... B29C 45/02; B29C 45/14
[52] U.S. Cl. ................... 264/219; 264/272.17; 425/116; 425/544; 425/588
[58] Field of Search .................................. 425/116, 117, 425/544, 588; 264/272.17, 219

[56] References Cited

U.S. PATENT DOCUMENTS

| | | | |
|---|---|---|---|
| 4,909,725 | 3/1990 | Ward | 425/588 |
| 4,915,608 | 4/1990 | Tsutsumi et al. | 425/588 |
| 5,071,334 | 12/1991 | Obara | 425/116 |
| 5,741,530 | 4/1998 | Tsunoda | 425/588 |

FOREIGN PATENT DOCUMENTS 6-29338  2/1994  Japan ...................... 425/588

Primary Examiner—Robert Davis
Attorney, Agent, or Firm—Jones Volentine, LLP

[57] ABSTRACT

A mold set for encapsulating semiconductor chips on lead frame strips with a molding compound supplied in tablets, includes a pot where molding compound tablets are loaded and pressed to form a fluid molding compound (FMC), and a main runner connected to the pot, through which the FMC passes from the pot. A plurality of sub-runners are connected to the main runner and are oriented substantially radially from a center region of the main runner. Each sub-runner has a proximal end, where it joins the main runner, and a distal end. A plurality of cavities are disposed on both sides of the main runner. Each of the plurality of cavities is in flow to communication with the distal end of a respective one of the plurality of sub-runners. The present invention allows the FMC to be introduced into all cavities at nearly the same time and at nearly a constant velocity.

5 Claims, 13 Drawing Sheets

PROCESS AND MOLD FOR
ENCAPSULATING SEMICONDUCTOR
CHIPS HAVING RADIAL RUNNERS

BACKGROUND OF THE INVENTION

1. Field of the Invention

The present invention generally relates to a mold used in the manufacture of semiconductor devices. More particularly, the present invention relates to a mold allowing a fluid molding compound to be introduced into all cavities at nearly the same time and at a nearly constant velocity by forming runners between a pot and all the cavities that have nearly equal distances and are radially oriented from a center point of a main runner.

2. Description of the Related Art

Highly integrated semiconductor devices are characterized by increased memory capacity, electric power consumption, performance speed, and mounting density. As a result, the number of leads connecting the semiconductor device package to an external apparatus has increased, and the leads are finer and more difficult to form. Therefore, the molding step in which the semiconductor chips, inner leads, and the electrical interconnections are encapsulated has become more important than ever.

Molding compounds which are used in the molding step must have particular characteristics consistent with these finer and denser contacts between the chip and lead frames. Such molding compound characteristics as thermal resistance, mechanical strength, thermal conductivity, hardness, abrasiveness, thermal expansion coefficient, and so on, must meet the characteristics of the chips, leads and bonding wires. Encapsulants, such as epoxy molding compound (EMC), form a package body and provide protection from external environmental stresses. The Transfer Molding Method is frequently employed for the encapsulation process. When circumstances are especially delicate, as in the case of electrical interconnections using a bonding wire as thin as about 23 $\mu$m to about 38 $\mu$m in diameter, a Low Pressure Transfer Molding Method is employed. Using this method, the bonding wire is not damaged during the molding step.

FIG. 1A is an cut-away perspective view of a conventional one-pot type molding device, and FIG. 1B is an enlarged perspective view of the portion 'A' from FIG. 1A.

Referring to FIG. 1A and FIG. 1B, a conventional molding device 100 includes a press 40 and a mold 70. The mold 70 consists of an upper mold 50 and a lower mold 60 which is separably coupled to the upper mold 50.

The press 40 has a support plate 20 which is mechanically connected to a vertically movable transfer means (not shown) and a cylinder 10 fixed to an upper surface of the support plate 20. The cylinder 10 contains hydraulic fluid 35 provided through a hydraulic inlet port 12 at the top of the cylinder and discharged through an outlet port 14 below the inlet, and it contains the upper part of a press rod 30. The lower part of the press rod 30 extends downward, below the cylinder 10.

The lower mold 60 is mounted onto and fixed to an upper surface of a base part (not shown) which is located at the lowermost part of the molding device 100. The lower mold 60 comprises a receive part 62 for receiving molding compound tablets, a plurality of runners 65 in flow communication with the receive part 62, a plurality of gates 66 which are connected to the runners 65, and a plurality of cavities 68 which are connected to the gates 66. The semiconductor package assembly, having electrical interconnections between a chip and a lead frame unit, is encapsulated within each cavity 68. In the mold, the runners 65 and gates 66 are essentially passages through which the molding compound passes, and the cavities 68 are the destinations where package bodies are formed from the molding compound.

The upper mold 50 is mechanically coupled to a vertically movable transfer means (not shown) at its upper surface or other parts, and has a pot 52 where the molding compound is loaded as tablets. The upper mold 50 has a runner structure symmetrical to that of the lower mold 60, except the upper mold 50 does not include a counterpart to the gates 66 of the lower mold 60.

For the lower mold 60, a set of runners 65 is composed of a main runner 64 in direct flow communication with the receive part 62, and a plurality of sub-runners 63 which extend from the main runner 64 and are in flow communication with the cavities 68 through the gates 66. There are several sets of runners in each lower mold 60. In the structure of the runners 65 of the conventional mold 70, the sub-runners 63 are substantially perpendicular to the main runner 64.

FIG. 2A is a cut-away perspective view depicting strips 90 of lead frame units within a lower mold of the molding device of FIG. 1A, and FIG. 2B is an enlarged perspective view of the portion 'B' from FIG. 2A. FIG. 3 is a cut-away perspective view for depicting the package assemblies after the molding step is completed. With reference to FIG. 2A, FIG. 2B and FIG. 3, the molding step and the operation process of the molding device 100 are described.

Lead frame strips 90 are placed onto the cavities 68 of the lower mold 60. The lead frame strips 90 comprise a plurality of lead frame units. Each lead frame unit has a chip 91, inner leads 93, and electrical interconnection means such as bonding wires 92, that connect the inner leads to the chip. The upper mold 50 is lowered by the transfer means (not shown), which is mechanically coupled to the upper mold 50, until the bottom surface of the upper mold 50 touches the upper surface of the lower mold 60. Thereafter, the molding compound tablets are introduced into the pot 52 of the upper mold 50 and receive part 62 of the lower mold 60.

The press 40 is lowered until the press rod 30 touches the upper surface of the tablets. The lowering of the press 40 is accomplished by the transfer means which is mechanically connected thereto. At this time, the tablets are melted by preheating the upper and lower molding dies 50 and 60, respectively, to a temperature in the range from about 170° C. to 180° C. or by using a separate tablet-preheating device. The hydraulic fluid 35 is then pressurized through the hydraulic inlet port 12 in the cylinder 10 which lowers the press rod 30. The lowered press rod 30 presses the fluid molding compound (FMC) 80 so that the FMC 80 flows from the pot 52, into the receive part 62, the runners 65, the gates 66, and the cavities 68. In each cavity 68 a lead frame unit from the lead frame strip 90 is encapsulated so that the chip 91, the inner leads 93, and the electrical interconnection means such as the bonding wires 92 are engulfed by the FMC 80. After the molding step is completed, the press 40 is elevated by the transfer means and the flow of the FMC is stopped. The FMC then hardens into the package body of the semiconductor package 95. Then the upper mold 50 is elevated by the transfer means and the lead frame strips 90 formed into package assemblies 95 are removed from the lower mold 60.

Because the bonding wires 93 are easily damaged by high viscosity fluids, the viscosity of the FMC 80 is usually as low as 200~500 PS (poises). The viscosity of the FMC increases with temperature and process time as the molding compound hardens; and the gelation point is the viscosity above which the molding compound ceases to move as a fluid. To reduce encapsulation process time, it is desired that the FMC be moved through the runners at a velocity sufficient to fill the cavities within 20 to 30 seconds while the FMC is still below the gelation point.

FIG. 4 is a graph depicting the state change of the molding compound during the molding step using the molding device of FIG. 1. Referring to FIG. 2A through FIG. 4, the relationship between the state of the molding compound and the molding process is described. The horizontal axis represents the time during the molding step, starting with the loading of the tablets up until the molding step is accomplished, in arbitrary units. The vertical axis represents the change of viscosity of the molding compound during the molding step. A point 'A' denotes viscosity of the molding compound tablets at the start of the molding step and a point 'B' denotes a point at which the molding compound tablets start melting to form the FMC 80 within the pot 52 of the mold 70. Between points 'C' and 'E' viscosities of the FMC are low enough to flow into the cavities 68 without damaging the bonding wires 92, i.e., the viscosity of point 'C' represents a safe level. A point 'D' denotes a point having the lowest viscosity. The viscosities below the safe level of the viscosity of 'C' and above viscosity of 'D' correspond to a working viscosity range in which the tablets are melted and flow readily into the respective cavities 68 within the mold 70 without damage to the bonding wires 92. The time interval between points 'C' and 'E', represents a safe time interval during which FMC can flow into the cavities 68 without damage to the bonding wires 92.

Before the point 'D', the viscosity is dropping gradually with the melting of the tablets, and after the point 'D', the viscosity is rising gradually due to the hardening of the molding compound with increasing temperature and process time. After the gelation point 'F', the FMC loses its fluidity, and the encapsulation is completed. At point 'G' the lead frame strips are separated from the mold. At point 'H' the molding compound is essentially completely hardened and thereafter the state does not change significantly.

Thus, it is desirable for the molding step to be accomplished during the safe time interval between points 'C' and 'E' so that the semiconductor chip, the inner leads and the bonding wires are not damaged by the flow of the FMC. Though it performs well in many ways, the conventional molding device 100 suffers from being unable to fill all the cavities completely during the safe time interval. The reasons for this deficiency are described next.

FIG. 5 depicts the result of numerical simulations for flow of the FMC in the conventional molding device 100. With reference to FIG. 3 through FIG. 5, the lowered press rod 30 compresses the FMC 80 from the molten tablets and causes the FMC 80 to flow into the pot 52, the main runner 64, the sub-runners 63, and the cavities 68. In the conventional structure 100 where the sub-runners 63 are perpendicular to the main runner 64, there is a substantial pressure drop in the main runner 64 from the location where the first sub-runner 63, closest to the pot, joins the main runner 64 at the first proximal end of the first sub-runner 63, to the location where the last sub-runner 63, farthest from the pot, joins the main runner 64 at the proximal end of that last sub-runner 63. Therefore the FMC 80 fills the cavities 68 beginning with the first cavity 68a closest to the pot 52 with greater force than the last cavity 68b farthest from the pot 52. Hereinafter, the pair of the cavities closest to the pot 52 are the first cavities 68a and a pair of the most distant cavities from the pot 52 are the last cavities 68b.

A transfer time is the time it takes for the FMC 80 to traverse from the pot 52 to a cavity 68. The difference between the transfer time when the FMC 80 fills the first cavity 68a and the transfer time when the FMC fills the last cavity 68b is the fill time interval, i.e., the time interval needed to fill all the cavities 68. It is preferable that the transfer times for all the cavities 68 occur in the safe time interval between points 'C' and 'E' and most preferably that all the transfer times occur near the time around the point 'D' when the FMC 80 has its lowest viscosity.

However, because the sub-runners 63 and the main runner 64 are perpendicularly connected, if the number of the cavities 68 along one main runner 64 from one pot 52 increases, the distance between the first cavity 68a and the last cavity 68b is lengthened, the transfer times and fill times increase, and the FMC 80 flows into the last cavity at a time beyond the 'C' to 'E' safe time interval. That is to say, the bonding wires 92 in the more distant cavities 68, including the last cavity 68b, are damaged by the flow of the FMC having high viscosity.

Even with a viscosity in the working viscosity range below the safe level, the bonding wires 92 can be damaged if the FMC 80 enters the cavity 68 at a velocity that is too high and voids can be created if the FMC 80 enters the cavity 68 at a velocity that is too low. The velocity of FMC entering a cavity 68 is related to the rate at which the cavity fills, i.e., the filling rate. FIG. 6 is a graph depicting the respective filling rates of the FMC, in terms of percent filled as a function of encapsulation time (rendered dimensionless by dividing by encapsulation time).

Referring to FIG. 6, a solid-lined curve 78a having a decreasing slope with time depicts the filling rate of the FMC 80 into the first cavity 68a and another solid-lined curve 78b having an increasing slope with time depicts the filling rate of the FMC 80 into the last cavity 68b. The slopes of the curves 78a and 78b represent the velocity profiles of the FMC 80 in the first and last cavities, respectively.

In the first cavity 68a, the FMC 80 starts with a high velocity while the pressure is high, and loses velocity as the cavity 68a fills. By contrast, in the last cavity 68b the FMC 80 starts filling when the pressure is low and thus has a low velocity at the start, then the FMC gains speed as the cavity 68b fills.

More specifically, in the conventional mold, the lowered press rod 30 causes the FMC to flow along the main runner 64. At the beginning, the pressure is greatest at the proximal end of the first sub-runner feeding the first cavity 68a, and the FMC rapidly fills the first cavity 68a closest to the pot. But, the pressure is still low at the proximal end of the last sub-runner feeding the last cavity 68b, thus, the FMC begins filling the last cavity 68b at a very low velocity. Therefore the last cavity 68b will have voids due to lower velocities during the start of the cavity's filling. That is, there is a large pressure gradient in the main runner 64 at the start of the process. The cavities more distant from the pot are less affected by the pressure of the press rod 30 on the FMC. The sub-runners 63 are perpendicular to the main runner 64, and thus the proximal ends of the sub-runners 63 branch off from the main runner 64 at very different distances along the main runner 64. At these different distances, therefore, the pressures created in the main runner 64 by the press rod 30 are very different. The last cavities feel less pressure and fill at a lower velocity at the start. At the end of the molding step, when the closer cavities are filled, there is less of a pressure drop from the pot to the distant cavities, the pressure is higher at the proximal end of the last sub-runner feeding the last cavity 68b, and the last cavity 68b fills at a higher rate. Thus in the last cavity 68b, the velocity at the end of the molding period is highest, as shown by the curve 78b in FIG. 6.

Thus a problem with the conventional molding device 100 is the large distances between where the proximal ends of the sub-runners 63 intersect the main runner 64, which leads to large differences in pressure, and thus to larger changes in velocity of FMC filling the cavities 68. The greater velocities can lead to damage of the bonding wires 92 and the lower velocities can lead to voids in the package body.

The other problem with the runners of the conventional mold device is that the FMC is sequentially introduced into the cavities 68 starting with the upper cavity 68a. The sequential introduction is a problem because the last cavity 68b is filled much later than the first cavity, close to or after the safe time interval, and the gate of the last cavity 68b is more easily blocked due to the increased hardening of the FMC at that time.

The straight line in FIG. 6 between the curve 78a of the first cavity 68a and the curve 78b of the last cavity 68b is an ideal filling line 79 which indicates an ideal filling rate. The ideal filling line 79 shows that the velocity of the FMC is constant and all the cavities are filled without voids and without damage to the bonding wires. The closer the filling curves 78a and 78b approximate the ideal filling line 79, the more ideal are the molds created in the cavities 68. The filling curves of the conventional mold deviate significantly from the ideal filling line.

Therefore, there is a need for a mold that will fill the first and last cavities closer together in time, and with smaller deviations in velocity, requiring a smaller drop in pressure, than is possible with the conventional molds.

SUMMARY OF THE INVENTION

Two main problems are caused by the structure of the runners in the conventional device. One problem with the conventional molding device 100 is the large distances between where the proximal ends of the sub-runners 63 intersect the main runner 64, which leads to large differences in pressure, and thus to larger changes in the velocity of FMC filling the cavities 6. Another problem is that the FMC is sequentially introduced into the cavities 68 starting with the upper cavity 68a. This sequence fills the last cavity 68b much later than the first cavity, which may be close to or after the safe time interval. It is an object of the present invention to reduce or eliminate these problems.

Accordingly, to achieve these and other objects and advantages, the present invention provides a mold having radial runners so that a fluid molding compound (FMC) with the same velocity can be introduced into all the cavities at nearly the same time by designing the distances between a pot and all the cavities to be roughly equal.

The present invention provides a mold set for encapsulating semiconductor chips on lead frame strips with a molding compound supplied in tablets, and includes a pot where molding compound tablets are loaded and pressed to form the FMC, and a main runner connected to the pot, through which the FMC passes from the pot. A plurality of sub-runners are connected to the main runner and are oriented substantially radially from a center region of the main runner. Each sub-runner has a proximal end where it joins the main runner and a distal end joining a cavity. A plurality of cavities are disposed on both sides of the main runner.

BRIEF DESCRIPTION OF THE DRAWINGS

The accompanying drawings illustrate the related arts and the embodiments of the invention, in which.

DETAILED DESCRIPTION OF THE INVENTION

The present invention relates to a mold device allowing an FMC to be introduced into all cavities at nearly the same time and at nearly a constant velocity. Preferred embodiments of the present invention are described next with reference to the accompanying drawings.

Figure 7A:
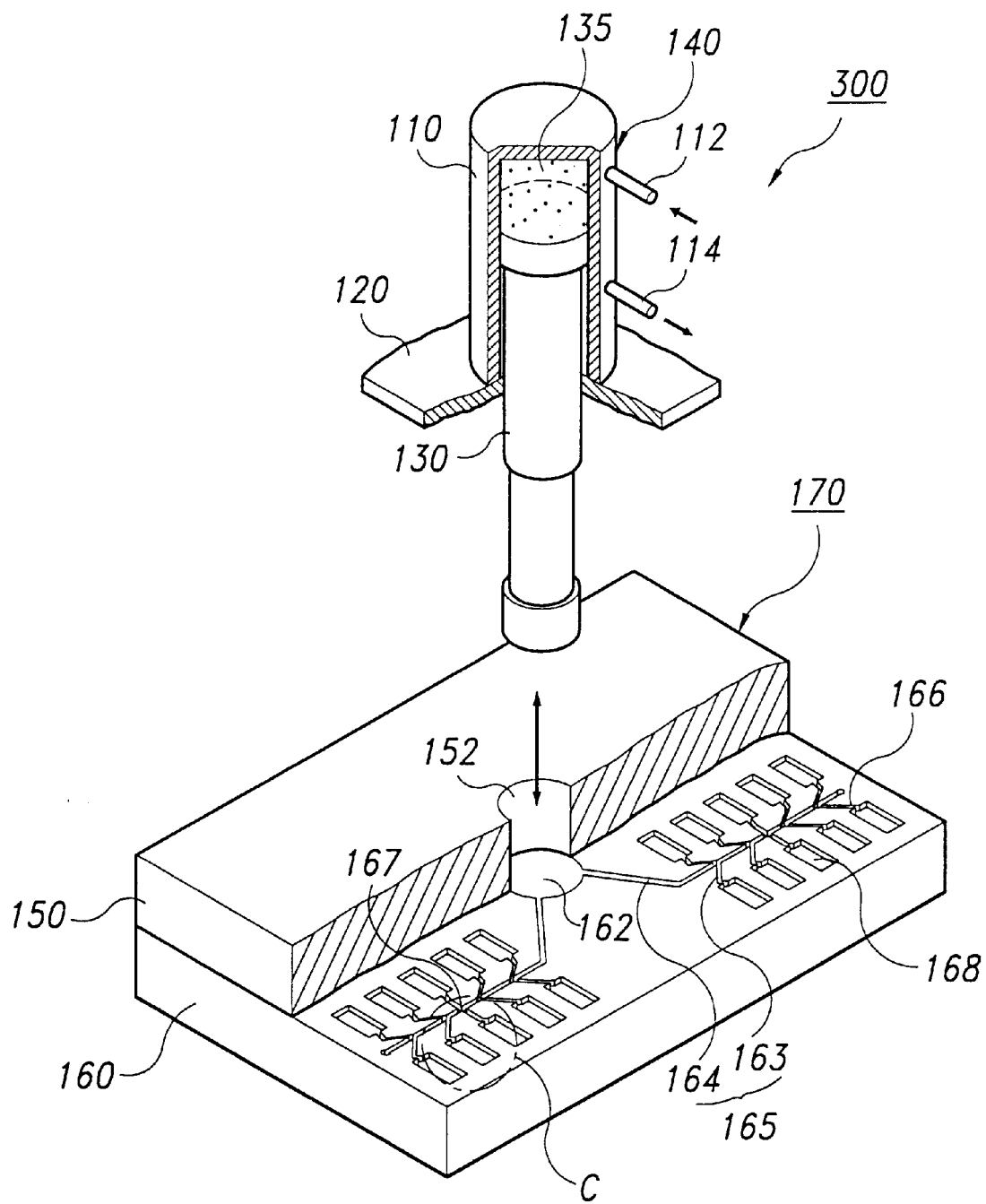
FIG. 7A is a cut-away perspective view for depicting a one-pot type molding device comprising a mold having radial runners according to the present invention.
Figure 7B:
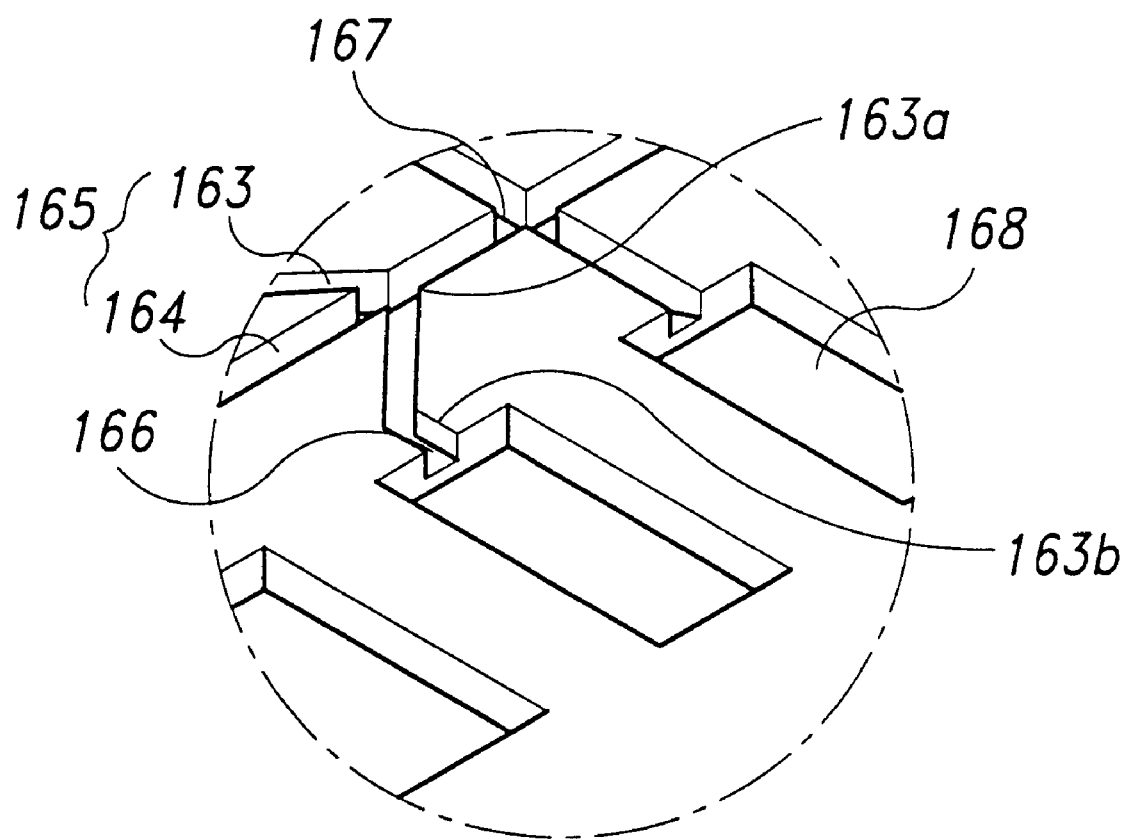
FIG. 7B is an enlarged perspective view of the portion 'C' in FIG. 7A.

FIG. 7A is a cut-away perspective view for depicting a one-pot type molding device 300 comprising a mold 170 having radial runners 163 according to the preferred embodiment of the present invention. FIG. 7B is an enlarged perspective view of the portion 'C' in FIG. 7A.

With reference to FIG. 7A and FIG. 7B, the lower mold 160 comprises a receive part 162 for receiving molding compound tablets which enter through a pot 152, a plurality of runners 165 in communication with the receive part 162, a plurality of gates 166 which are connected to the runners 165, and a plurality of cavities 168 which are connected to the gates 166. The runners 165 are composed of a main runner 164 connected to the receive part 162 and a plurality of sub-runners 163 which extend from the main runner 164 and are in flow communication with the cavities 168. Each sub-runner 163 is connected at a proximal end 163a to the main runner 164 and at a distal end 163b to a cavity 168.

Figure 8:
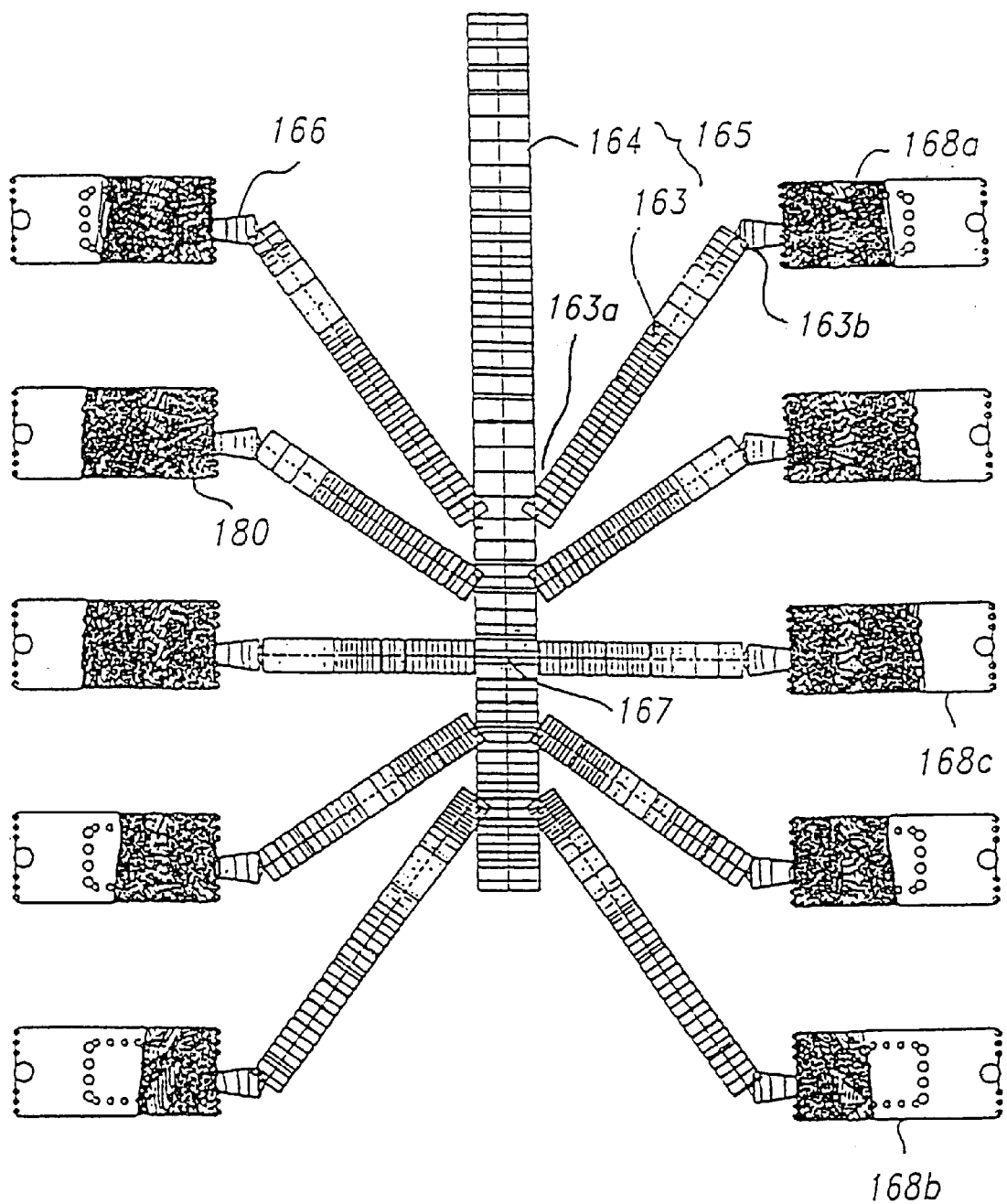
FIG. 8 depicts the result of simulations for flow of an FMC by a molding device according to the present invention.

As shown in FIG. 8, the sub-runners 163 are approximately radial to a small region 167 around the center of the main runner 164 (hereinafter, referred to as a "central region"). Each of a pair of cavities on both sides of the central region 167 is called a central cavity 168c. Each of a pair of the cavities closest to the pot 152 is called a first cavity 168a, and each of a pair of the most distant cavities from the pot 152 is called a last cavity 168b. There are corresponding first and last sub-runners 163 with corresponding first and last proximal ends, and first and last distal ends, respectively.

In the preferred embodiment, the gates 166 through which the sub-runners 163 are connected to respective cavities 168 are perpendicular to the respective cavities 168 as in the conventional case. The reason is that the electrical interconnections, such as bonding wires, and the inner leads of the lead frame can be damaged by the FMC if the FMC enters a cavity toward one side of the cavity rather than toward the center of the cavity. This would occur if the gate directing the FMC into the cavity were connected to the cavity 168 with an acute angle, not perpendicularly.

In the preferred embodiment, the molding device 300 of the present invention has an odd number of pairs of cavities 168 on both sides of the main runner 164; for example, FIG. 7A shows 5 pairs. In the preferred embodiment, only the central cavities 168c are connected to the main runner 168 by sub-runners 163 that are perpendicular to the main runner 168. The other cavities 168, except the central cavities 168c, are connected to the main runner 164 by sub-runners 163 having acute angles with reference to the main runner 164. In other embodiments with an even number of pairs of cavities 168, all the cavities 168, without exception, are connected to the main runner by sub-runners 163 having acute angles with respect to the main runner 164.

According to the present invention, the mold 170 is designed so that flow distances from the pot 152 to the cavities 168 which are disposed between the pot 152 and the central region 167 are substantially equal. However, the flow distances from the pot 152 to the cavities 168 which are disposed beyond the central region 167 are slightly longer than the flow distances from the pot 152 to the cavities 168 which are disposed between the pot 152 and the central region 167. The difference from the shortest flow distance to the longest flow distance is designed so that the difference in transfer times is shorter than the duration of the safe time interval and all the transfer times occur within the safe time interval.

Figure 1A:
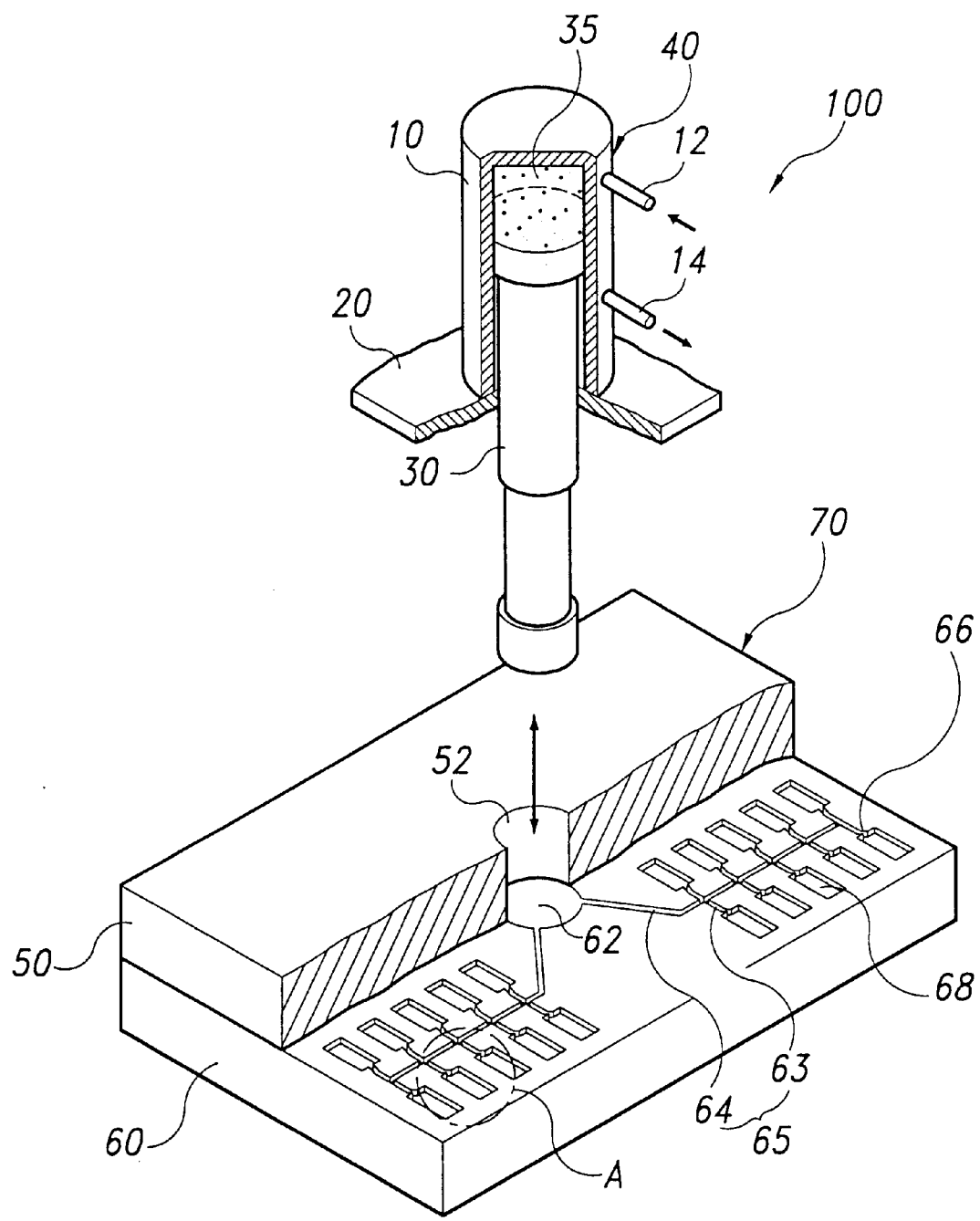
FIG. 1A is a cut away perspective view of a conventional one-pot type molding device.
Figure 1B:
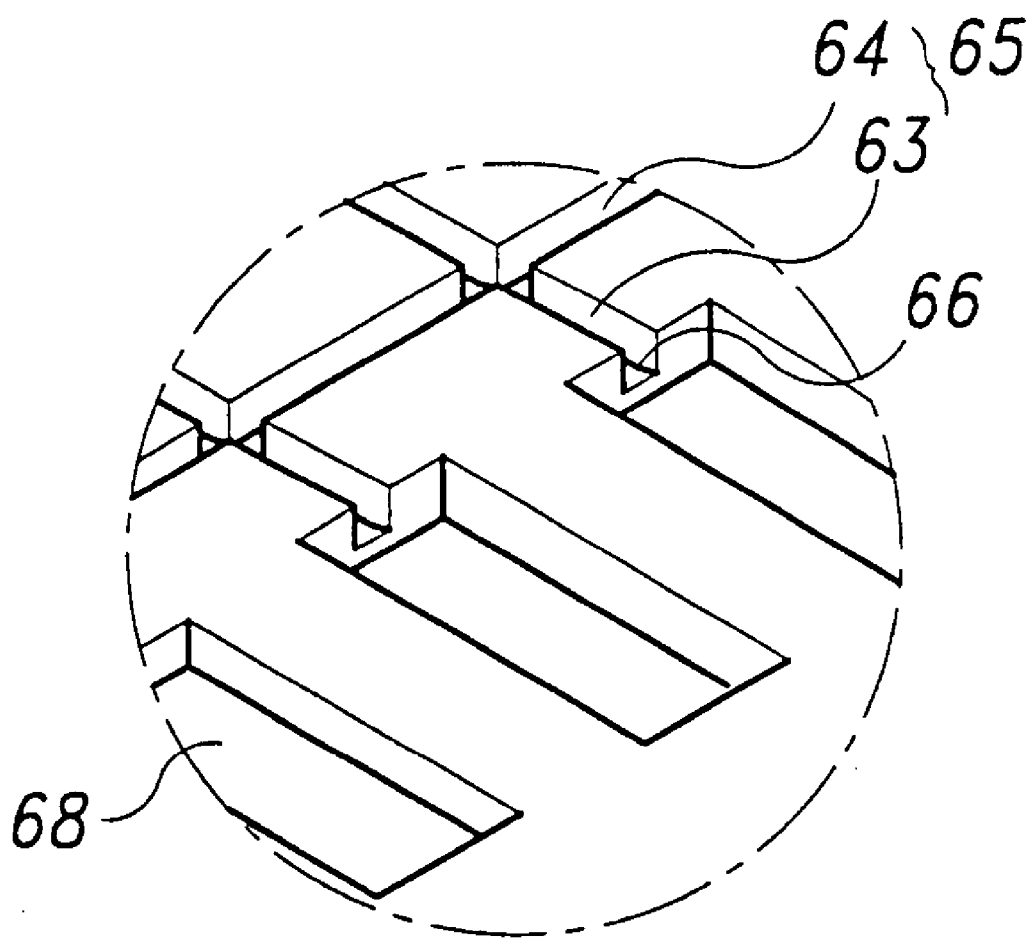
FIG. 1B is an enlarged perspective view of the portion 'A' in FIG. 1A.
Figure 2A:
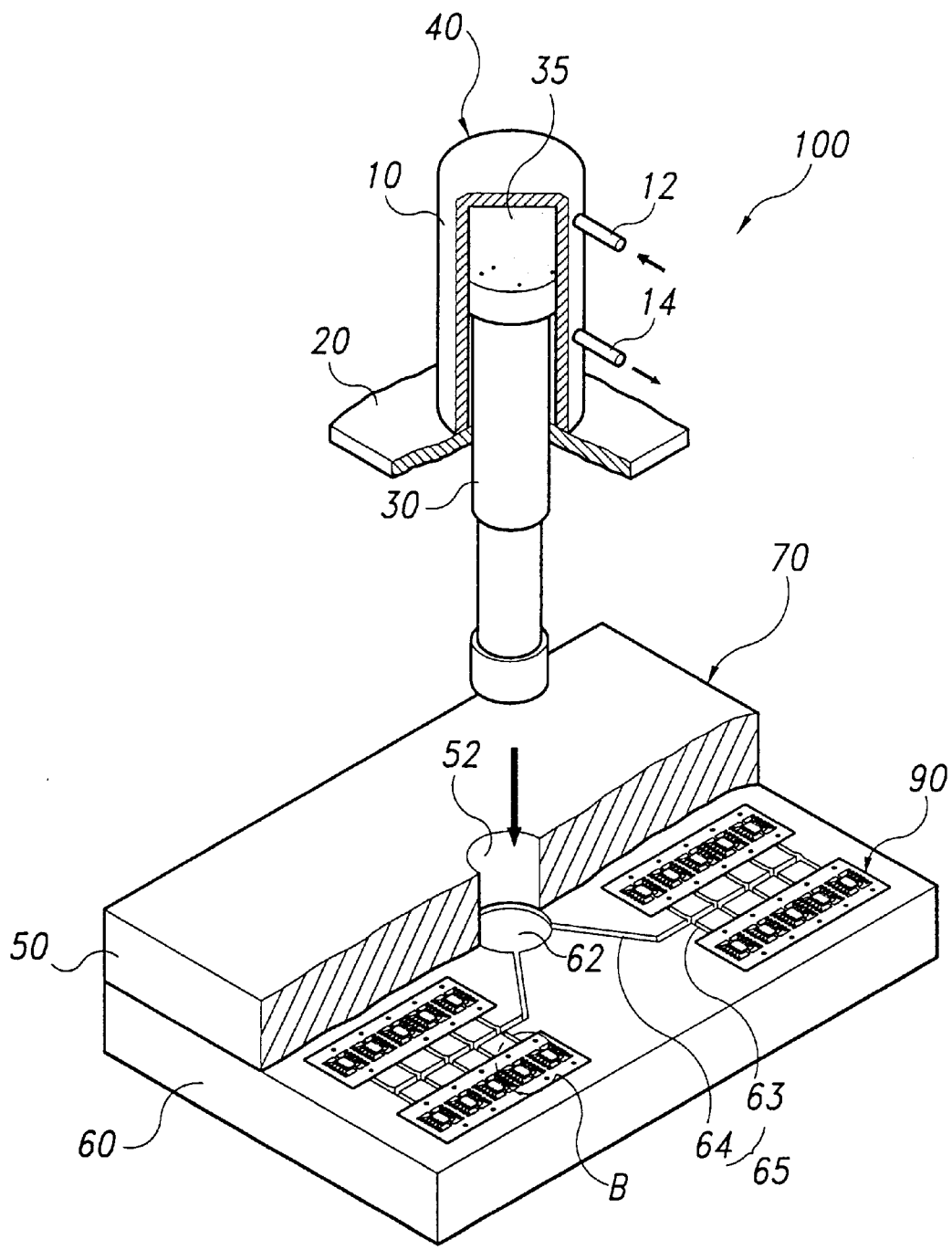
FIG. 2A is a cut-away perspective view depicting strips of lead frame units within a lower mold of the molding device of FIG. 1.
Figure 2B:
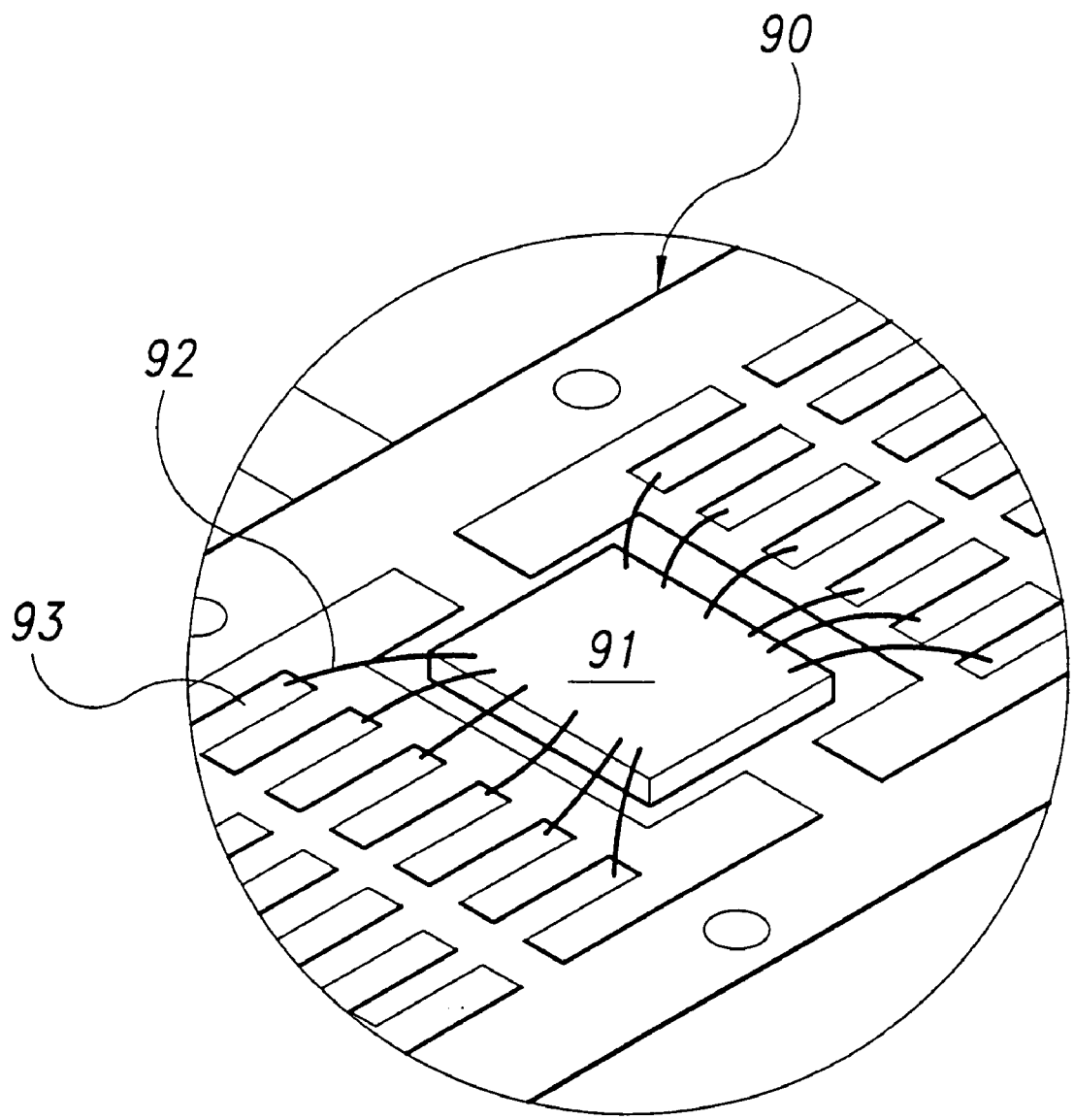
FIG. 2B is an enlarged perspective view of the portion 'B' in FIG. 2A.
Figure 3:
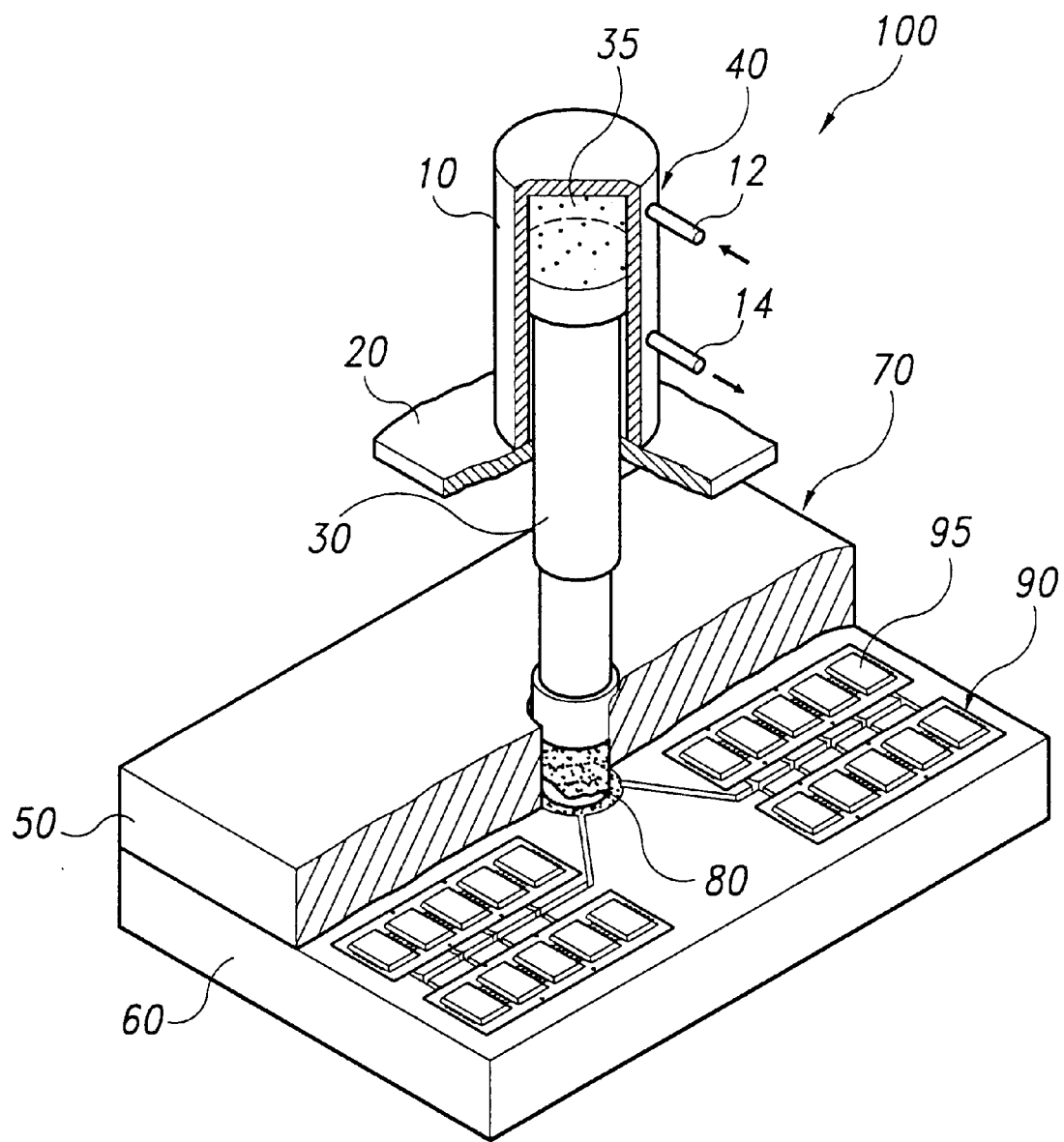
FIG. 3 is a cut-away perspective view depicting the package assemblies after the molding step is completed.
Figure 4:
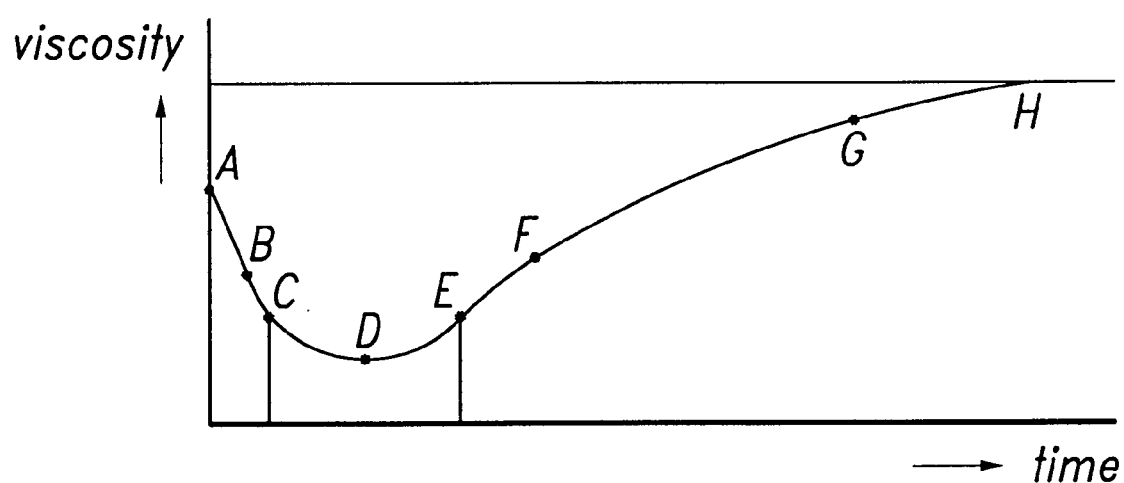
FIG. 4 is a graph depicting the state change of the molding compound during a molding process.

Other structures of the mold 300 of the present invention are the same as the corresponding structures of the conventional mold (100 in FIG. 1A), so further detailed description of their structure and operation is omitted.

The operation of the molding device 300 according to the present invention is described next. FIG. 8 depicts the result of numerical simulations for flow of the FMC by a molding device according to the present invention; and FIG. 9 is a schematic diagram for comparing the plan view of a runner of the present invention with that of a conventional runner.

Figure 9:
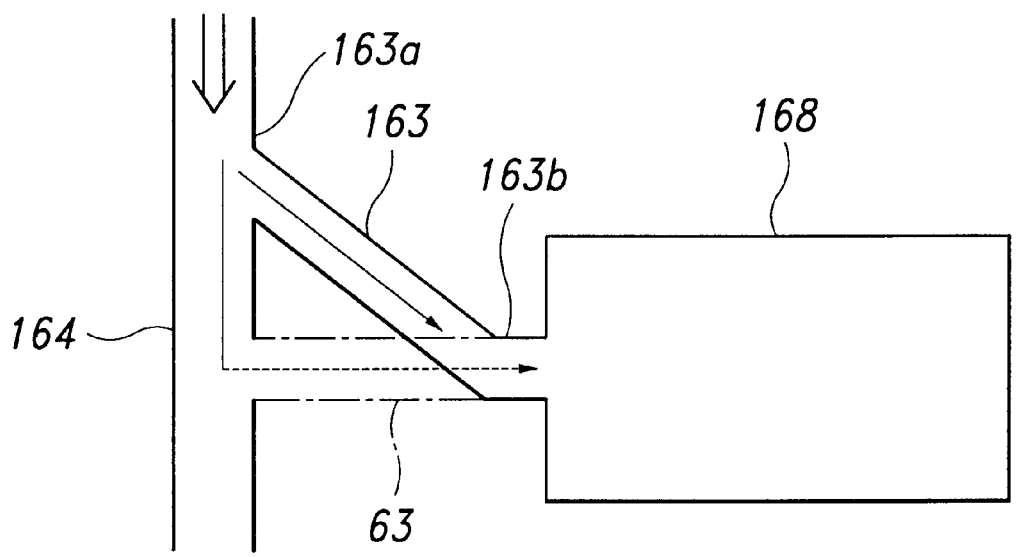
FIG. 9 is a schematic diagram for comparing the plan view of a runner of the present invention with that of a conventional runner.

With reference to FIG. 7 through FIG. 9, the lowered press rod 130 presses the molding compound tablets in the molten state so that the FMC 180 flows into the pot 152, the main runner 164, the radial sub-runners 163, and the cavities 168 where the lead frame strip assembly (not shown) is placed.

FIG. 8 shows the flow of the FMC 180 into all the cavities 168 of the preferred embodiment, at the time of 17.5 sec (of the total encapsulation process time of 20 sec) by using numerical simulation. FIG. 8 shows that nearly the same amount of the FMC 180 is introduced into all the cavities 168 on both sides of the main runner 164. That is to say, the radial runners 163 of the present invention have an advantage over the conventional device in that the flow of the FMC 180 into all the cavities 168, including the central, the first, and the last cavities 168c, 168a, and 168b, respectively, is substantially more uniform. In addition, by decreasing the interval between the positions where the sub-runners 163 branch off from the main runner 164, compared to the structure of the conventional runners, the pressure and velocity differences are smaller and more ideal, as described below.

Referring to FIG. 9, the FMC (80 in FIG. 5) is introduced into the cavity along the dotted-lined sub-runner 63 in the structure of the conventional runners; but for the present invention, the FMC 180 is introduced into the cavity 168 along the solid-lined sub-runner 163. Therefore, in the present invention, the flow distance of the flow of the FMC 180 from the main runner 164 to the cavity 168 decreases, compared to the conventional case, for those cavities 168 farther from the pot 152 than the central region 167. That is, the cavity 168 depicted in FIG. 9 is a cavity between the central region 167 and the last cavity 168b.

On the other hand, because the length of the sub-runner 163 which is disposed between the central region 167 of the main runner 164 and the pot 152 is longer than that of the conventional case, the flow distance of the flow of the FMC 180 from the main runner 164 to the cavity which is disposed between the first cavity 168a and the central region 167 increases, compared to the conventional case.

As a result, the longest flow distance of the present invention is shorter than the longest flow distance of the conventional device; and the shortest flow distance of the present invention is greater than the shortest flow distance of the conventional device. Therefore the range of flow distances, i.e., the difference in flow distances, is smaller than in the conventional device. As a consequence the differences in transfer times is smaller than in the conventional device and can be designed more easily to fall completely within the safe time interval.

Figure 5:
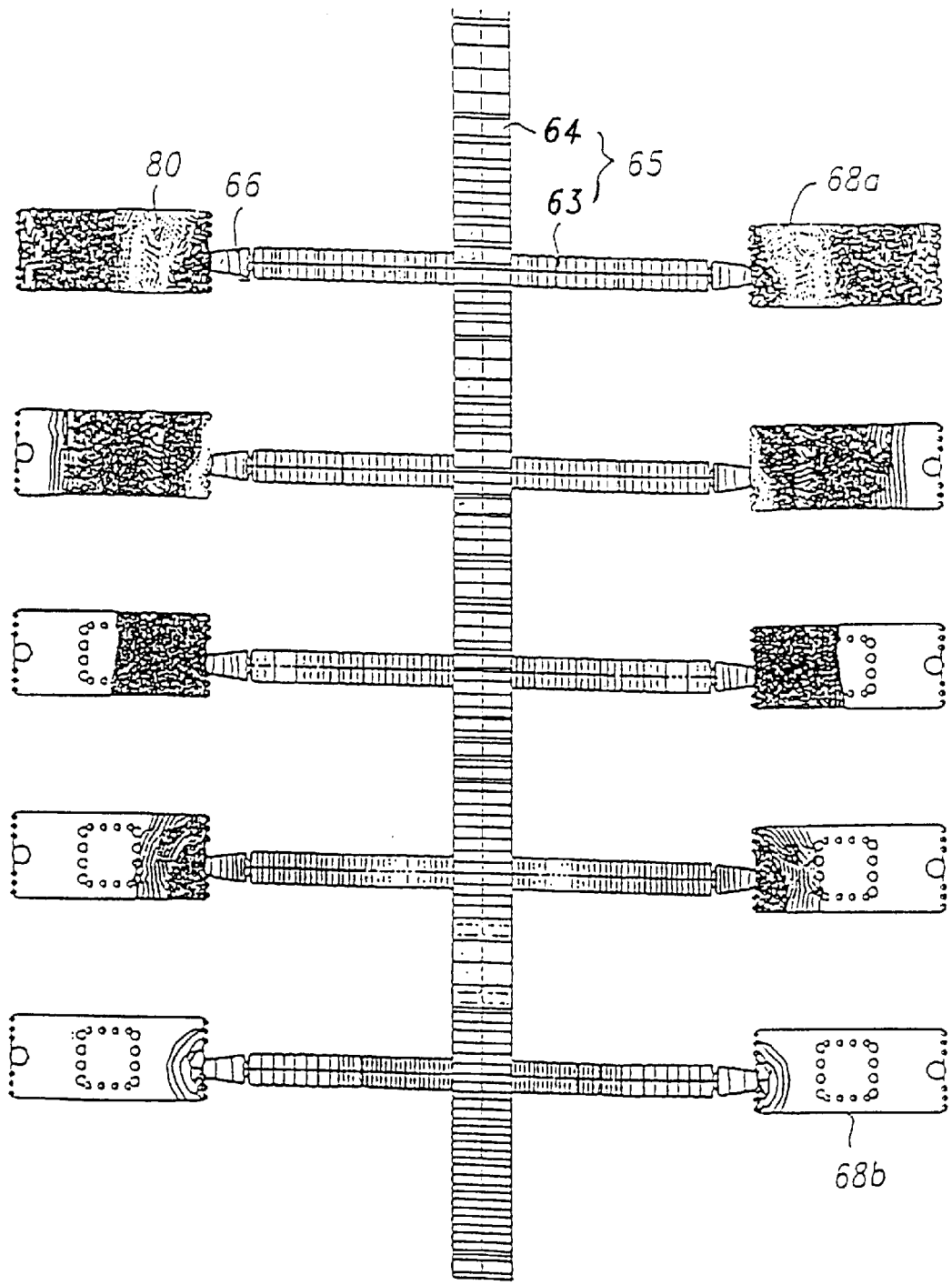
FIG. 5 depicts the result of simulations for flow of an FMC in the conventional molding device of FIG. 1.

In the molding device 300 of the present invention, as shown in FIG. 8 for the preferred embodiment, the FMC 180 is introduced into the cavities 168 starting with the central cavity 168c which has the shortest distance from the pot 152, and last fills the last cavity 168b which has the greatest distance. That is to say, the FMC 180 fills the respective cavities 168 slightly differently depending on the position of the cavity; however, this difference is very slight, compared to the conventional device (FIG. 5).

Figure 6:
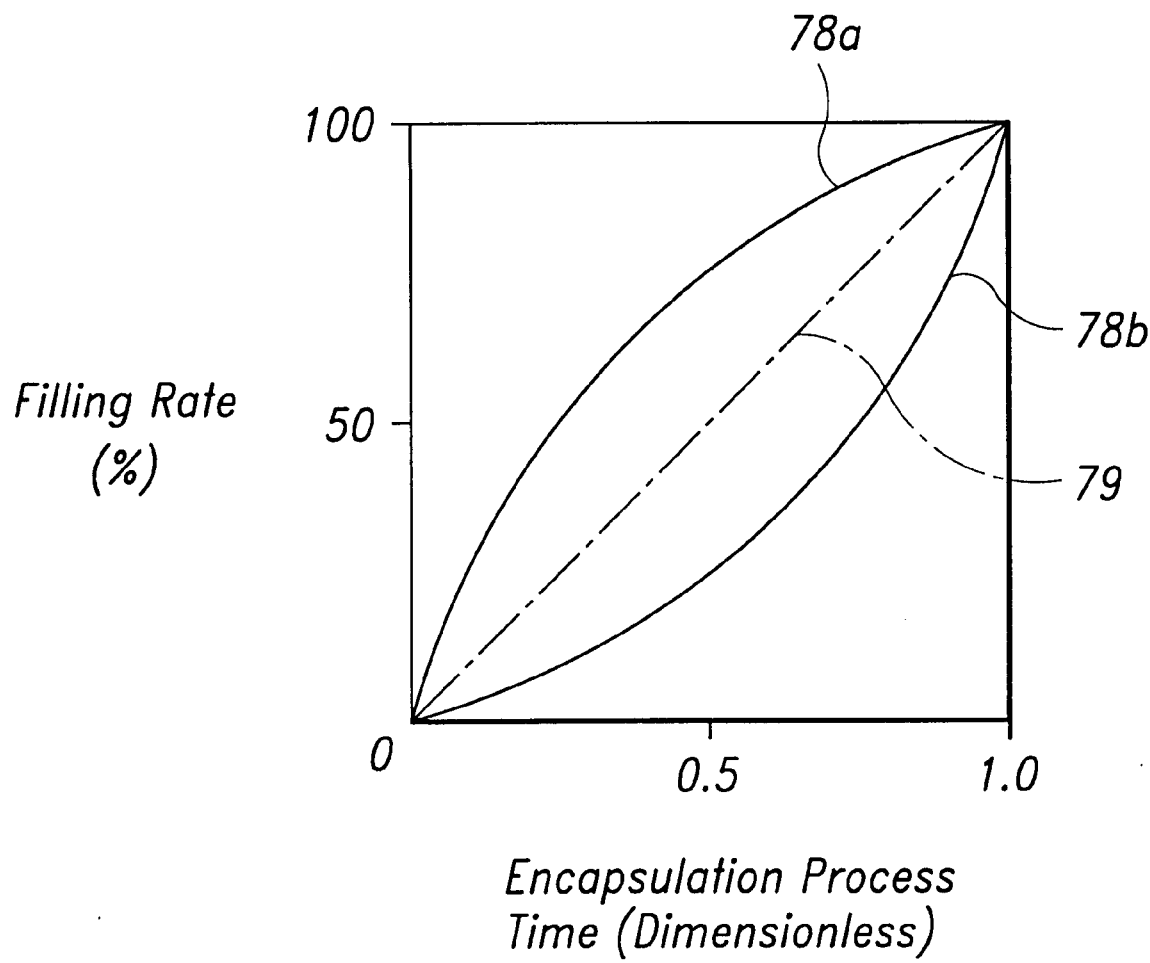
FIG. 6 is a graph depicting the respective filling rates of the FMC within a first cavity and a last cavity for the conventional molding device of FIG. 1.
Figure 10:
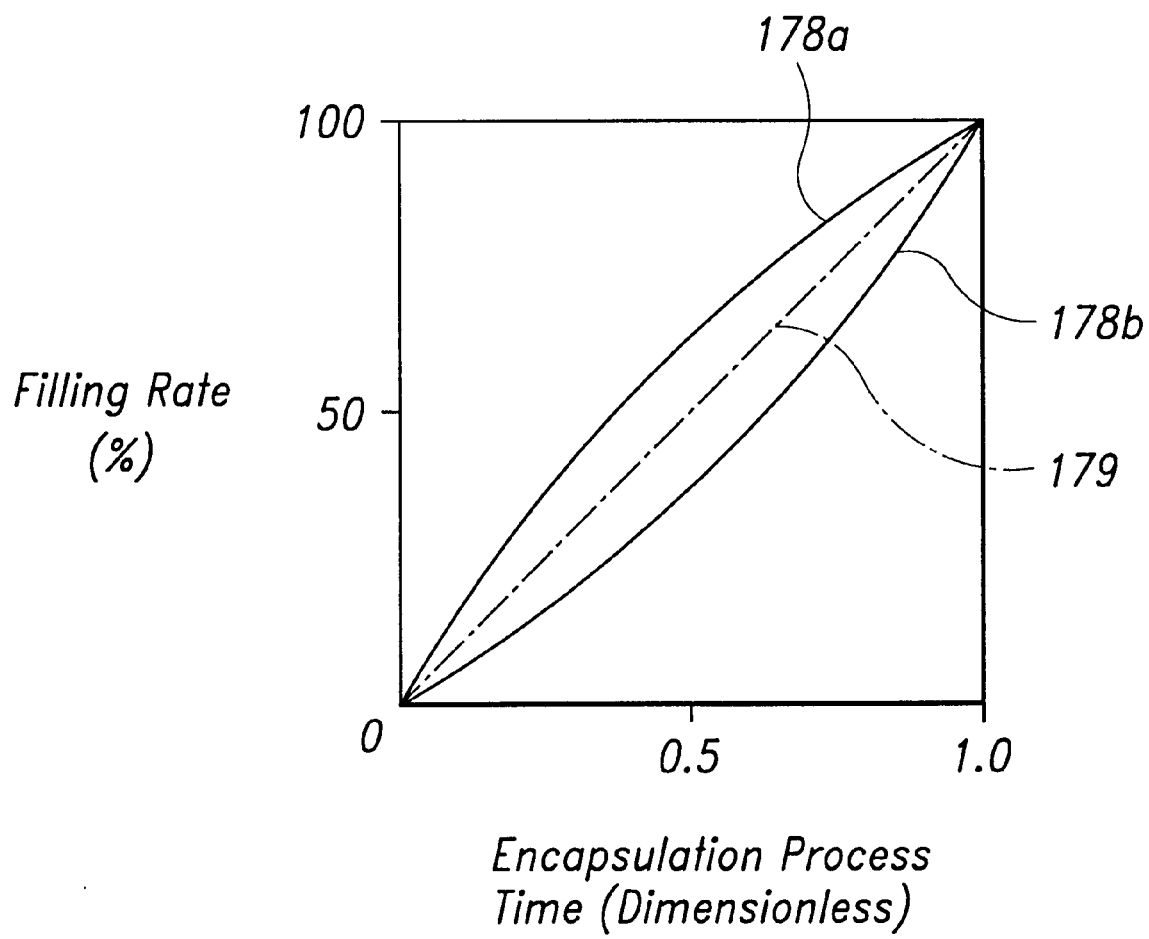
FIG. 10 is a graph depicting the respective filling rates of the molding compound within a first cavity and a last cavity resulting from the present invention.

FIG. 10 is a graph for depicting the respective filling rates of the molding compound within a first cavity and a last cavity. In the conventional device, at the start of the molding process, the filling rate of the molding compound is the greatest within a first cavity and is the least in a last cavity. However, in the present invention, the interval between the positions where proximal ends of the sub-runners branch off from the main runner 164 is smaller. Therefore the proximal ends experience a smaller pressure change. As a result, the FMC is introduced into all the cavities 168 with nearly the same pressure, hence all the cavities are filled with nearly the same velocity. Although the filling rates of the FMC 180 within a first cavity 168a and the last cavity 168b are slightly different, FIG. 10 shows that the velocities of the molding compound 180 within all the cavities 168 are nearly equal and closer to the ideal constant velocity than in the conventional device (FIG. 6). Consequently, both a curve 178a which shows the filling rate into the first cavity 168a and a curve 178b which shows the filling rate into the last cavity 168b are closer to an ideal constant filling line 179 than the curves of the conventional case (78a, 78b in FIG. 6).

According to the present invention, then, radial runners have the advantages that the FMC is introduced into all the cavities, including the first and the last cavities, at nearly the same time, and that the total transfer time is reduced.

Further, the present invention has another advantage in that the FMC is introduced into all the cavities, including the first and the last cavities, with nearly the same, close to ideal, velocity. Thus voids within the cavities and the damage to the bonding wires by the molding compound can be prevented.

It will be apparent to those skilled in the art that various modifications and variations can be made in the embodiments of the molding device of the present invention described herein without departing from the spirit or scope of the invention. Thus, it is intended that the present invention cover the modifications and variations of this invention provided they come within the scope of the appended claims and their equivalents.

What is claimed is:

1. A mold set for encapsulating semiconductor chips on lead frame strips with a molding compound supplied in tablets, comprising:

a pot where molding compound tablets are loaded and pressed to form a fluid molding compound (FMC);

a main runner connected to the pot, through which the FMC passes from the pot;

a plurality of sub-runners connected to the main runner, oriented substantially radially from a center region of the main runner, each sub-runner having a proximal end where it joins the main runner and a distal end; and a plurality of cavities disposed on both sides of the main runner, each of the plurality of cavities being in flow communication with the distal end of a respective one of the plurality of sub-runners.

2. A mold set of claim 1, wherein
the plurality of sub-runners has a number equal to an odd number of pairs, and
each sub-runner of a middle sub-runner pair is perpendicular to the main runner at the center region of the main runner.

3. A mold set of claim 1, wherein the proximal ends of the plurality of sub-runners are positioned so that the distance between the first proximal end and the center region and the last proximal end and the center region is less than a predetermined distance.

4. A mold set of claim 3, further comprising a plurality of gates, each of the plurality of gates connected to a corresponding one of the plurality of cavities and to the distal end of a respective one of the plurality of sub-runners, oriented so that each of the plurality of gates is substantially perpendicular to the corresponding one of the plurality of cavities.

5. A method for encapsulating semiconductor chips on lead frame strips with a molding compound, comprising:

providing a main runner connected to a source of the molding compound;

connecting a plurality of sub-runners to the main runner, the sub-runners being oriented substantially radially from a center region of the main runner, each sub-runner having a proximal end where it joins the main runner and a distal end; and connecting a plurality of cavities disposed on both sides of the main runner, each of the plurality of cavities being in flow communication with the distal end of a respective one of the plurality of sub-runners and having a semiconductor chip disposed therein; and selecting respective lengths for the respective sub-runners such that the molding compound flows into the respective cavities during a flow time period, wherein the selecting step comprises,
determining a viscosity of the molding compound,
determining a velocity of the molding compound,
using the viscosity and velocity of the molding compound, calculating a flow transfer time along the respective lengths of the sub-runners, and
adjusting the respective lengths of the sub-runners such that all the respective cavities are filled during the flow time period.

* * * * *